US012787363B2

(12) United States Patent
Guler et al.

(10) Patent No.: US 12,787,363 B2
(45) Date of Patent: Nov. 3, 2026

(54) WALL COUPLED WITH TWO STACKS OF NANORIBBONS TO ELECTRICAL ISOLATE GATE METALS

(71) Applicant: Intel Corporation, Santa Clara, CA (US)

(72) Inventors: Leonard P. Guler, Hillsboro, OR (US); Sukru Yemenicioglu, Portland, OR (US); Shengsi Liu, Portland, OR (US); Shao Ming Koh, Tigard, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 209 days.

(21) Appl. No.: 17/958,290

(22) Filed: Sep. 30, 2022

(65) Prior Publication Data

US 2024/0113233 A1 Apr. 4, 2024

(51) Int. Cl.
*H10D 30/67* (2025.01)
*H10D 30/62* (2025.01)
*H10D 62/10* (2025.01)

(52) U.S. Cl.
CPC ......... *H10D 30/6757* (2025.01); *H10D 30/62* (2025.01); *H10D 30/673* (2025.01); *H10D 62/121* (2025.01)

(58) Field of Classification Search
CPC .. H10D 30/6757; H10D 30/62; H10D 30/673; H10D 30/014; H10D 30/43; H10D 30/6735; H10D 62/121; H10D 64/01; H10D 64/017; H10D 64/518; H10D 84/0151; H10D 84/038; H10D 84/83; B82Y 10/00
See application file for complete search history.

(56) References Cited

U.S. PATENT DOCUMENTS

2022/0093592 A1* 3/2022 Guler .................. H10D 84/038
2022/0359506 A1* 11/2022 Ng .................... H10D 84/0158

* cited by examiner

*Primary Examiner* — Calvin Y Choi
(74) *Attorney, Agent, or Firm* — Schwabe, Williamson & Wyatt, P.C.

(57) ABSTRACT

Embodiments described herein may be related to apparatuses, processes, systems, and/or techniques for techniques for creating a wall within a forkFET transistor structure, where the wall is adjacent to a first stack of nanoribbons on a first side of the wall and a second stack of nanoribbons on a second side of the wall opposite the first side of the wall. In embodiments, the wall extends beyond the top of the first stack of nanoribbons and electrically isolates a first gate metal coupled with the first stack of nanoribbons and a second gate metal coupled with the second stack of nanoribbons from each other. Other embodiments may be described and/or claimed.

23 Claims, 16 Drawing Sheets

B - B'
SOURCE/DRAIN CROSS SECTION

END VIEW

A - A'
GATE CROSS SECTION

WALL COUPLED WITH TWO STACKS OF NANORIBBONS TO ELECTRICAL ISOLATE GATE METALS

FIELD

Embodiments of the present disclosure generally relate to the field of semiconductor manufacturing, and in particular to manufacturing forkFET transistor structures.

BACKGROUND

Continued growth in virtual machines, cloud computing, and portable devices will continue to increase the demand for high density transistors within chips and packages. In addition, there will be an increased need for reducing the size of transistor structures within semiconductor packages.

DETAILED DESCRIPTION

Figure 1C:
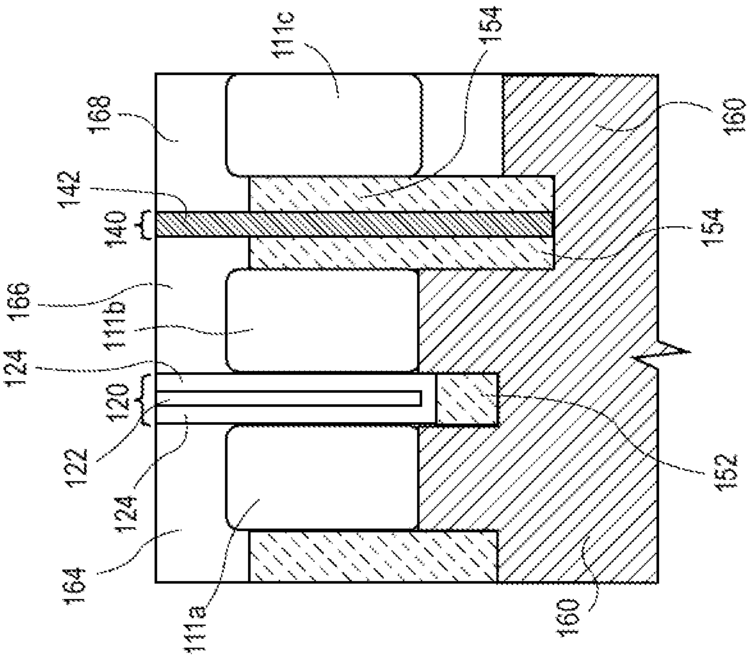
FIGS. 1A-1E illustrate cross section side views, a cross-section end view, and cross section perspective views of a forkFET transistor structure that includes a wall coupled with two stacks of nanoribbons and a gate cut to isolate devices in the transistor structure, in accordance with various embodiments.

Embodiments described herein may be related to apparatuses, processes, systems, and/or techniques for creating a wall within a forkFET transistor structure, where the wall is adjacent to a first stack of nanoribbons on a first side of the wall and a second stack of nanoribbons on a second side of the wall opposite the first side of the wall. In embodiments, the wall extends beyond the top of the first stack of nanoribbons and beyond the top of the second stack of nanoribbons.

In embodiments, the wall separates a first gate metal coupled with the first stack of nanoribbons from a second gate metal coupled with the second stack of nanoribbons. In embodiments, the wall may electrically isolate the first gate metal from the second gate metal. In embodiments, the wall may separate two devices within the transistor structure. In embodiments, gate cuts may be used in addition to walls within a transistor structure to isolate devices.

In embodiments, forkFET transistor structures may be used, as compared to gate all around nanoribbon transistor structures, in order to shrink overall cell dimensions and as a result include more transistors into a smaller footprint by not requiring a gate metal to surround all sides of a nanoribbon. In forkFET transistor structures, gate metal surrounds three sides of the nanoribbon, where the fourth side is coupled with a wall on a first side that may be shared with another set of nanoribbons coupled with the second side of the wall. In embodiments the wall may be referred to as the center of two tri-gates.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Figure 1B:
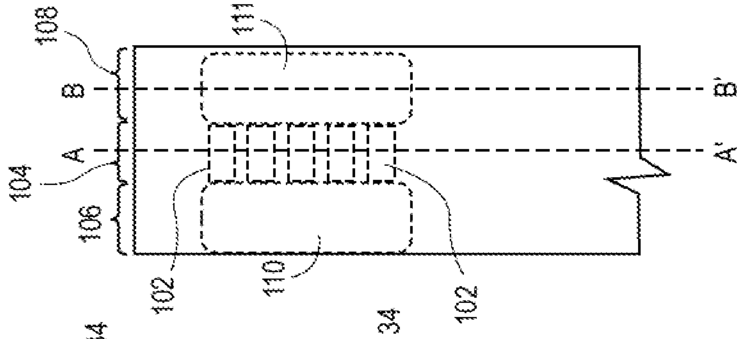
Figure 1A:
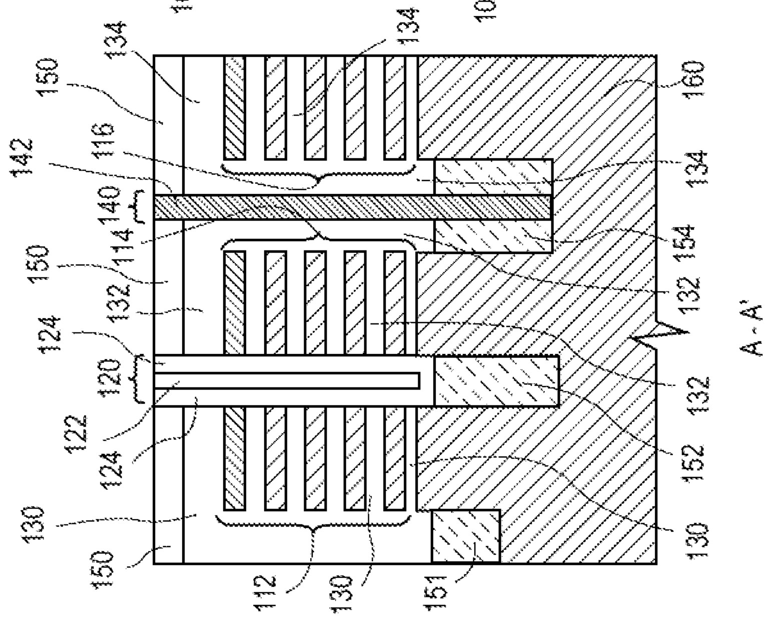

FIGS. 1A-1E illustrate cross section side views, a cross-section end view, and cross section perspective views of a forkFET transistor structure that includes a wall coupled with two stacks of nanoribbons and a gate cut to isolate devices in the transistor structure, in accordance with various embodiments. FIG. 1A, FIG. 1B, and FIG. 1C show various views of an embodiment of a forkFET transistor structure. FIG. 1B is cross-section end view of the embodiment that shows a stack of nanoribbons 102 within a gate 104, and a epitaxial layer 110 within a source 106, and a epitaxial layer 111 within a drain 108.

FIG. 1A illustrates a gate cross-section view along A-A' through the gate 104 of FIG. 1B, that shows a first stack of nanoribbons 112, a second stack of nanoribbons 114, and the third stack of nanoribbons 116, which may be similar to the stack of nanoribbons 102 of FIG. 1B. In embodiments, the stack of nanoribbons 112, 114, 116 may include silicon or silicon germanium. In embodiments, the first stack of nanoribbons 112 and the second stack of nanoribbons 114 may be physically coupled to a wall 120.

In embodiments, the first stack of nanoribbons 112 may be surrounded by a first gate metal 130, the second stack of nanoribbons 114 may be surrounded by a second gate metal 132, and the third stack of nanoribbons 116 may be surrounded by a third gate metal 134. In embodiments, the wall 120 separates the first gate metal 130 and the second gate metal 132. In embodiments, the wall 120 electrically isolates the first gate metal 130 and the second gate metal 132 from each other.

In embodiments, the wall 120 may include an inner wall material 122, which may include a low dielectric constant material that may be easily etched during the manufacturing process. In embodiments, the inner wall material 122 may include HfO, AlN, AlO, or TiO. In embodiments, the wall 120 may include an outer wall material 124 that may include SiOC, SiO, or SiNC. In embodiments, the outer wall material 124 may be more difficult to etch during the manufacturing process then the inner wall material 122. In embodiments, the outer wall material 124 may partially or completely surround the inner wall material 122. In embodiments, the inner wall material 122 may be the same as the outer wall material 124. In some embodiments, the wall 120 may be forms of a single material.

In embodiments, the wall 120 may in total have a high dielectric constant. In some embodiments, the inner wall material 122 may have a higher dielectric constant than the outer wall material 124. In embodiments, the inner wall material 122 may be thinner or substantially thinner than the outer wall material 124.

In embodiments, a gate cut 140 that is filled with a dielectric 142 may be made from above the second gate metal 132 through to below the second gate metal 132. In embodiments, the gate cut 140 separates the second gate metal 132 from the third gate metal 134. In embodiments, the gate cut 140 may electrically isolate the second gate metal 132 and the third gate metal 134 from each other. In embodiments, a gate insulator layer 150 may be on top of the first gate metal 130, the second gate metal 132, or the third gate metal 134. In embodiments, the gate insulator layer 150, which may be referred to as a layer of insulation, may include silicon, nitrogen, oxygen, carbon, SiN, SiO, SiOC, and/or SiC.

In embodiments, there may be a first dielectric 151 below and to the left of the first stack of nanoribbons 112 and beneath the first gate metal 130. Below the wall 120 there may be a second dielectric 152. At or below the gate cut 140 there may be a third dielectric 154. In embodiments, the first dielectric 151, the second dielectric 152, or the third dielectric 154 may include SiO, SiN, or the like. Below the wall 120, the first dielectric 151, the second dielectric 152, the gate cut 140, and the third dielectric 154 may be on a substrate 160, which may be a substrate layer, that may include silicon.

FIG. 1C illustrates a drain cross-section view along B-B' through the drain 108 of FIG. 1B. Similarly, FIG. 1C could also be a representation of a source cross-section view through the source 106 of FIG. 1B. First epitaxial layer 111*a*, which may be coupled with the first stack of nanoribbons 112 of FIG. 1A, and the second epitaxial layer 111*b*, which may be coupled with the second stack of nanoribbons 114 of FIG. 1A, may be coupled with opposite sides of the wall 120. In embodiments, the first epitaxial layer 111*a* and the second epitaxial layer 111*b* may be electrically isolated by the wall 120.

In embodiments, the gate cut 140 may separate the second stack of nanoribbons 114 and the second epitaxial layer 111*b* from a third epitaxial layer 111*c*, which may be coupled with the third stack of nanoribbons 116 of FIG. 1A. In embodiments, the first epitaxial layer 111*a*, the second epitaxial layer 111*b*, and the third epitaxial layer 111*c* may be similar to epitaxial layer 111 of FIG. 1B.

In embodiments, a first trench connector 164 may be electrically coupled with the first epitaxial layer 111*a*, a second trench connector 166 may be electrically coupled with the second epitaxial layer 111*b*, and a third trench connector 168 may be electrically coupled with the third epitaxial layer 111*c*. In embodiments, the first trench connector 164 and the second trench connector 166 may be electrically isolated from each other by the wall 120. In embodiments, the second trench connector 166 and the third trench connector 168 may be electrically isolated from each other by the gate cut 140.

Figure 1D:
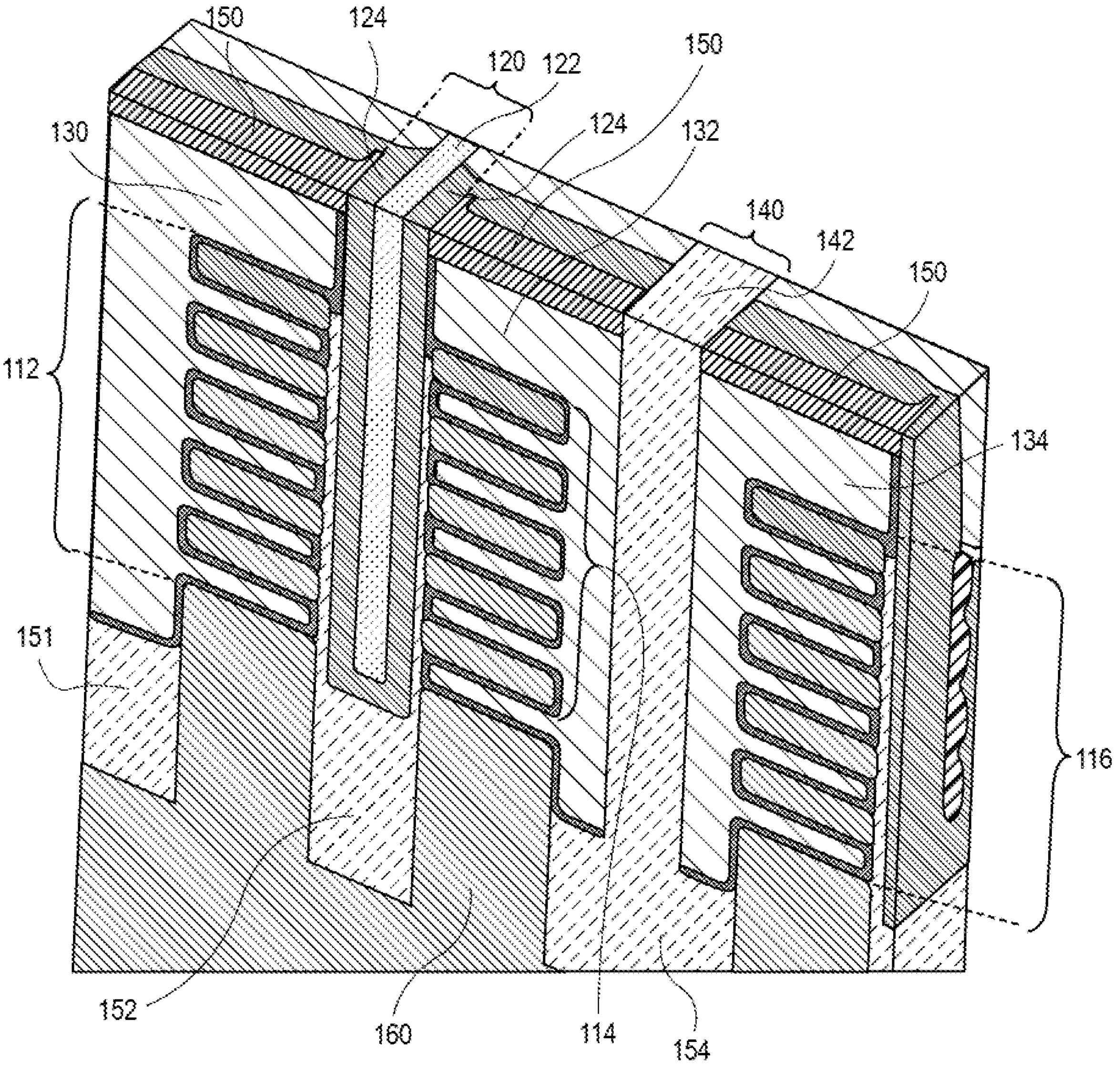
Figure 1E:
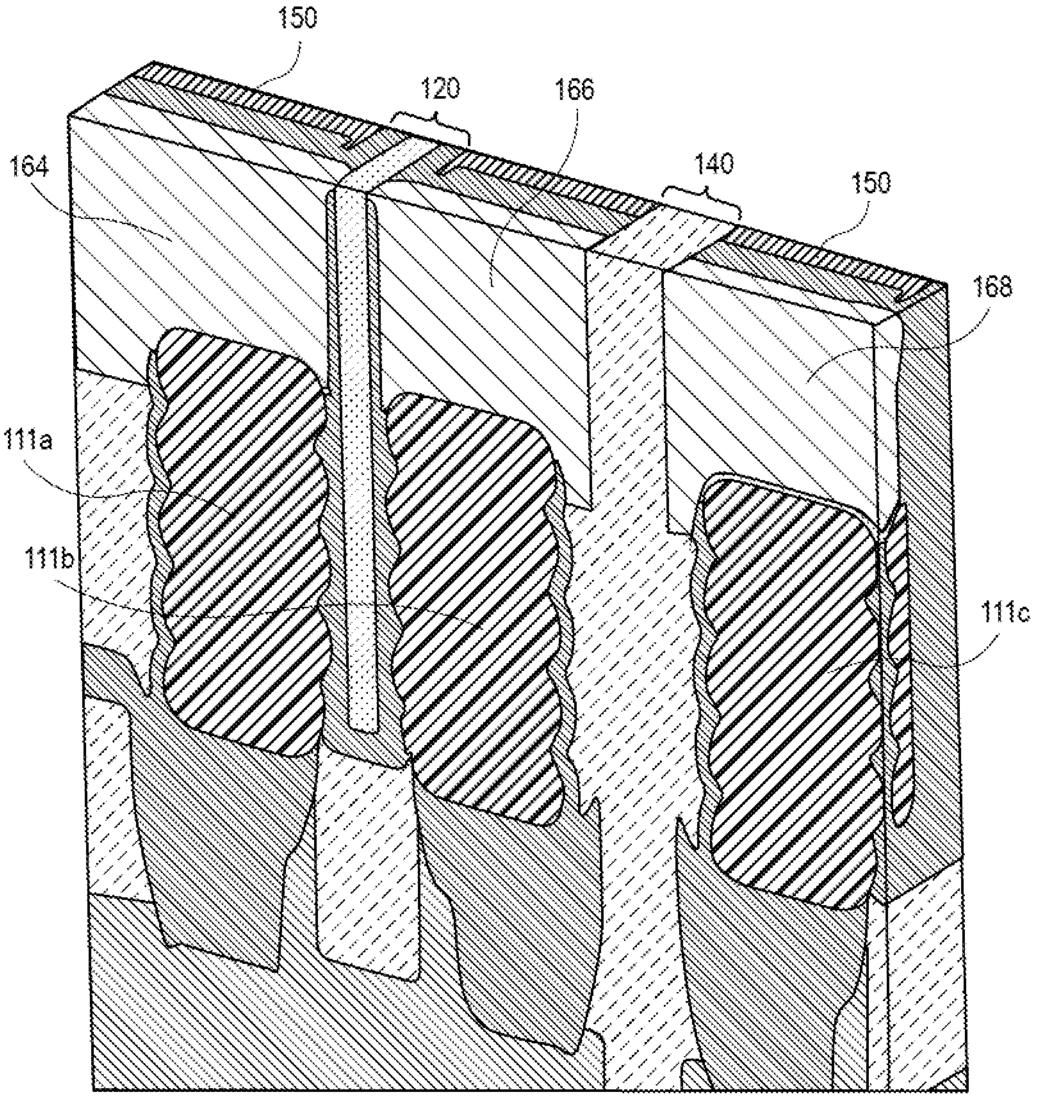

FIG. 1D shows a perspective view, which may be similar to FIG. 1A, of a cross-section through the gate 104 of FIG. 1B. FIG. 1E shows a perspective view, which may be similar to FIG. 1C, of a cross-section through the drain 108 of FIG. 1B.

FIGS. 2A-2J illustrates perspective views of various stages in a manufacturing process for creating a forkFET transistor structure that includes a wall coupled with two stacks of nanoribbons to electrically isolate gate metals, in accordance with various embodiments.

Figure 2A:
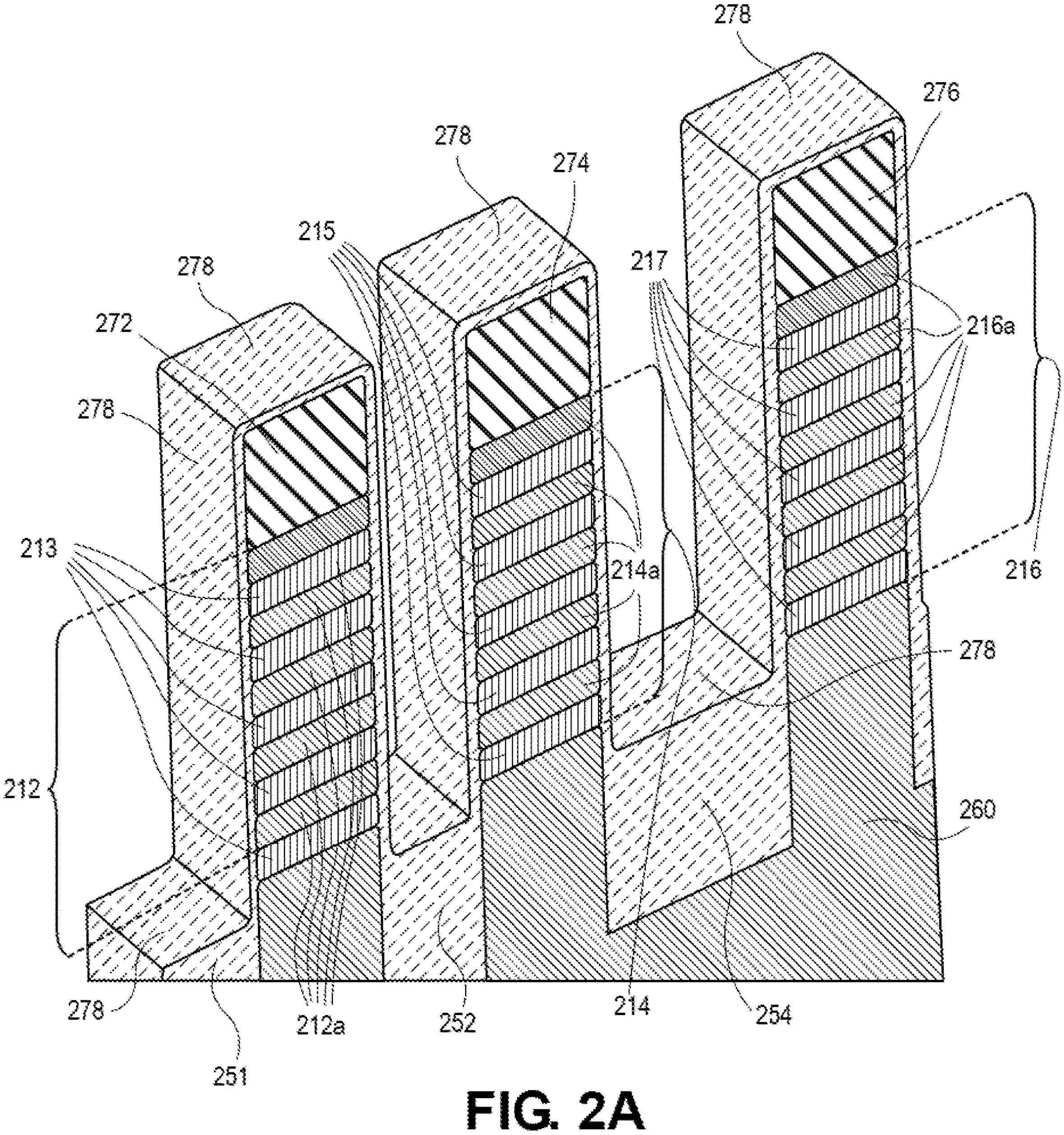
FIGS. 2A-2J illustrates perspective views of various stages in a manufacturing process for creating a forkFET transistor structure that includes a wall coupled with two stacks of nanoribbons to electrically isolate gate metals, in accordance with various embodiments.

FIG. 2A illustrates a perspective view of a stage in the manufacturing process where a first stack of nanoribbons 212, which may be similar to first stack of nanoribbons 112 of FIG. 1A, a second stack of nanoribbons 214 which may be similar to second stack of nanoribbons 114 of FIG. 1A, and a third stack of nanoribbons 216 which may be similar to third stack of nanoribbons 116 of FIG. 1A may be formed on a substrate 260. In embodiments, substrate 260 may be similar to substrate 160 of FIG. 1A.

In embodiments, the first stack of nanoribbons 212 may include individual nanoribbons 212*a* that may be separated by a sacrificial material 213. The second stack of nanoribbons 214 may include individual nanoribbons 214*a* that may be separated by a sacrificial material 215. The third stack of nanoribbons 216 may include individual nanoribbons 216*a* that may be separated by a sacrificial material 217. In embodiments, the individual nanoribbons 212*a*, individual nanoribbons 214*a*, individual nanoribbons 216*a*, as well as sacrificial material 213, 215, 217 may be formed by etching individual layers at a previous stage (not shown) in the manufacturing process. In embodiments, first dielectric 251, second dielectric 252, and third dielectric 254 may also be formed on top of the substrate 260, in the stacks of nanoribbons 212, 214, 216.

A first spacer 272 may be formed on top of the first stack of nanoribbons 212, a second spacer 274 may be formed on top of the second stack of nanoribbons 214, and a third spacer 276 may be formed on top of the third stack of nanoribbons 216. In embodiments, the spacers 272, 274, 276 may include silicon. In embodiments, a protective oxide layer 278 may be placed over and around the first dielectric 251, the second dielectric 252, the third dielectric 254, the first stack of nanoribbons 212 and the first spacer 272, the second stack of nanoribbons 214 and the second spacer 274, the third stack of nanoribbons 216 and the third spacer 276.

Figure 2B:
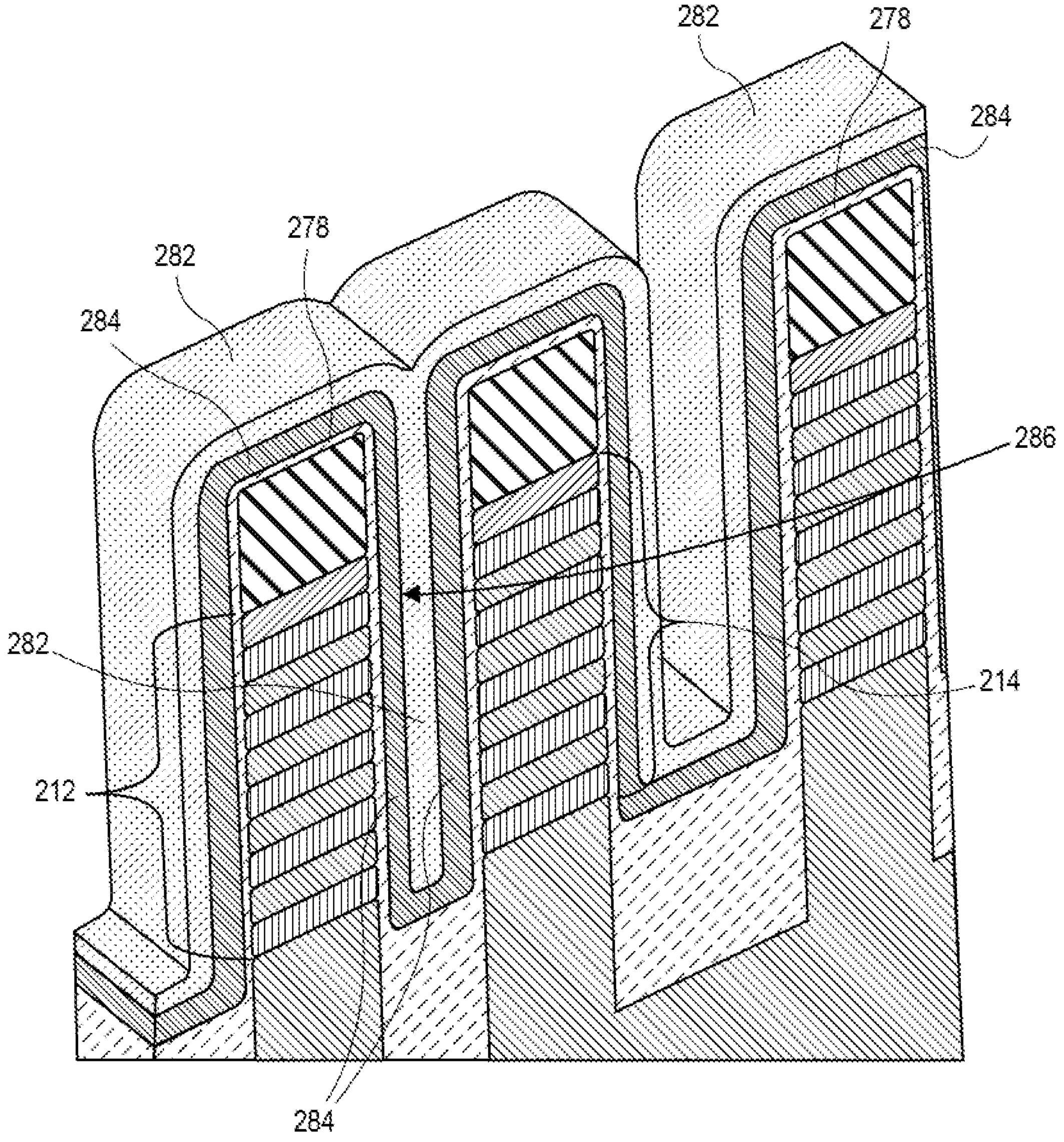

FIG. 2B illustrates a perspective view of a stage in the manufacturing process where a first layer 284 is placed on the oxide layer 278, and a second layer 282 is placed on the first layer 284. In embodiments, the material of the first layer 284 may be similar to the material used in the outer wall material 124 of FIG. 1A, and the material of the second layer 282 may be similar to the inner wall material 122 of FIG. 1A. In embodiments, the first layer 284 and the second layer 282 may completely fill a volume 286 between the first stack of nanoribbons 212 and the second stack of nanoribbons 214.

In embodiments, the first layer 284 may be more highly resistant to etching, and the second layer 282, may be less resistant to etching. In embodiments, the first layer 284 may have a lower dielectric constant, and the second layer 282 may have a higher dielectric constant.

Figure 2C:
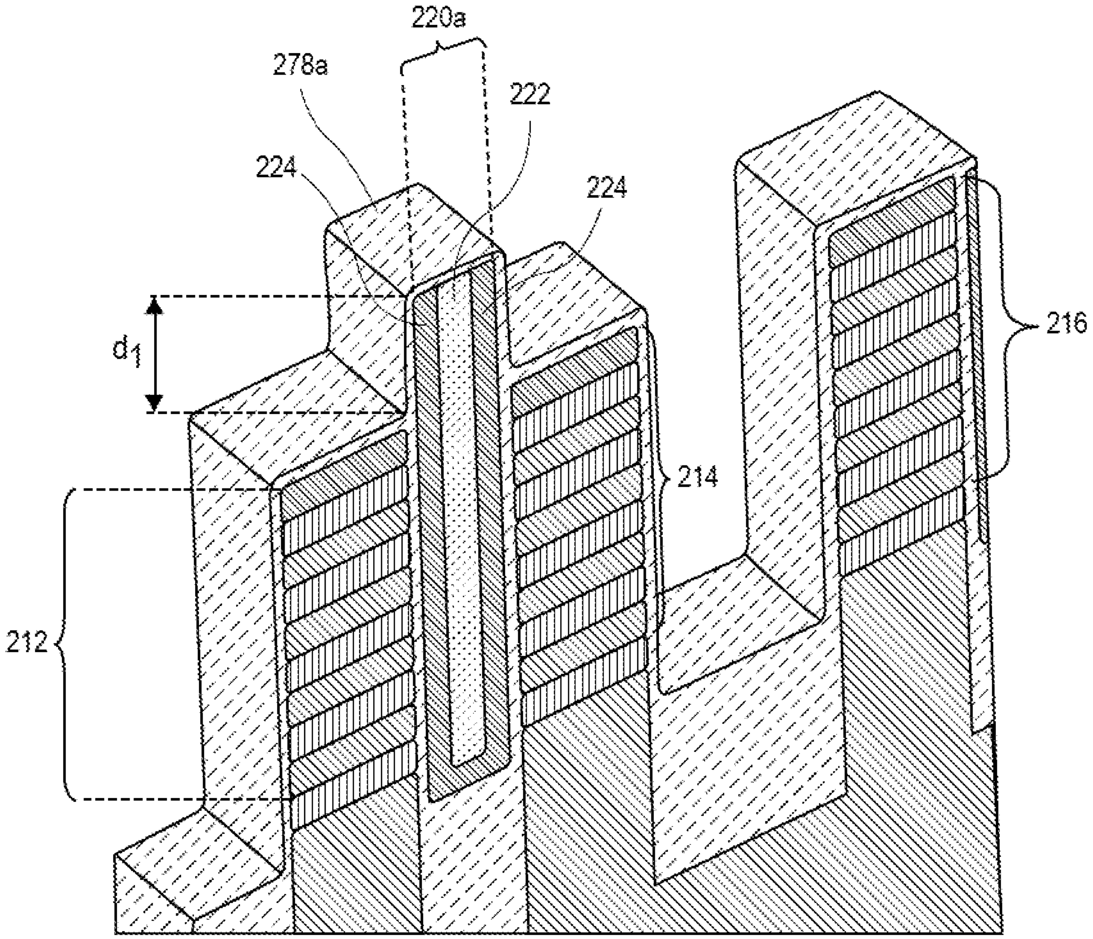

FIG. 2C illustrates a perspective view of a stage in the manufacturing process where an etch is performed to remove the first spacer 272, the second spacer 274, and the third spacer 276 of FIG. 2A, as well as to remove portions of the first layer 284 and the second layer 282 of FIG. 2B, leaving wall structure 220*a*, which may be similar to wall 120 of FIG. 1A, that includes an inner wall material 222 and an outer wall material 224, which may be similar to inner wall material 122 and outer wall material 124 of FIG. 1A. In embodiments, another oxide layer 278*a*, which may be similar oxide layer 278 of FIG. 2A, may be applied on top of the wall structure 220*a*, and on top of the first stack of nanoribbons 212, the second stack of nanoribbons 214, and the third stack of nanoribbons 216. In embodiments, a height of the wall structure 220*a* may be a distance dl above the first stack of nanoribbons 212 and the second stack of nanoribbons 214, where dl may be selected to separate gate metals from each other, as discuss further with respect to FIG. 2F.

Figure 2D:
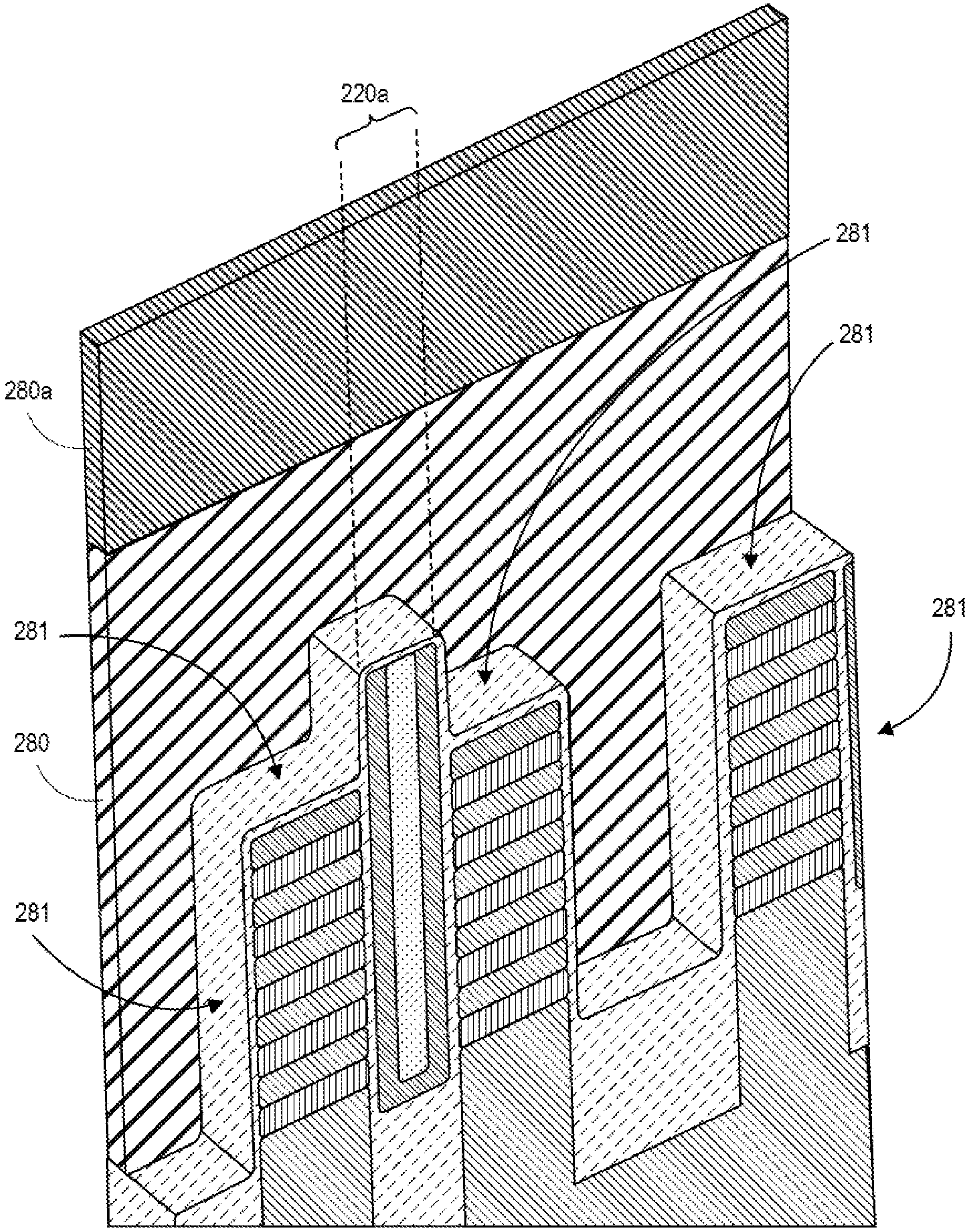

FIG. 2D illustrates a perspective view of a stage in the manufacturing process where a dummy gate 280 and a dummy gate cap 280*a* are formed. In embodiments, the location of the dummy gate 280 and the dummy gate cap 280*a* are similar to the location of the region of the gate 104 in the end view of FIG. 1B. In embodiments, the dummy gate 280 may be silicon, and the dummy gate cap 280*a* may include a dielectric. In embodiments, a sequence of etchings and depositions (not shown) may be used to form the dummy gate 280, as known in the art.

As a result of the dummy gate 280 and the dummy gate cap 280*a* being formed, a residual layer 281 may be left on either side of the dummy gate 280. The residual layer 281 may include portions of the first stack of nanoribbons 212, the stack of nanoribbons 214, and the third stack of nanoribbons 216 of FIG. 2C that will be etched away prior to the next manufacturing stage shown in FIG. 2E. The wall structure 220*a* will not be etched away. In embodiments, this residual layer 281 may be similar to the source 106 or the drain 108 regions as shown in the end view of FIG. 1B.

Figure 2E:
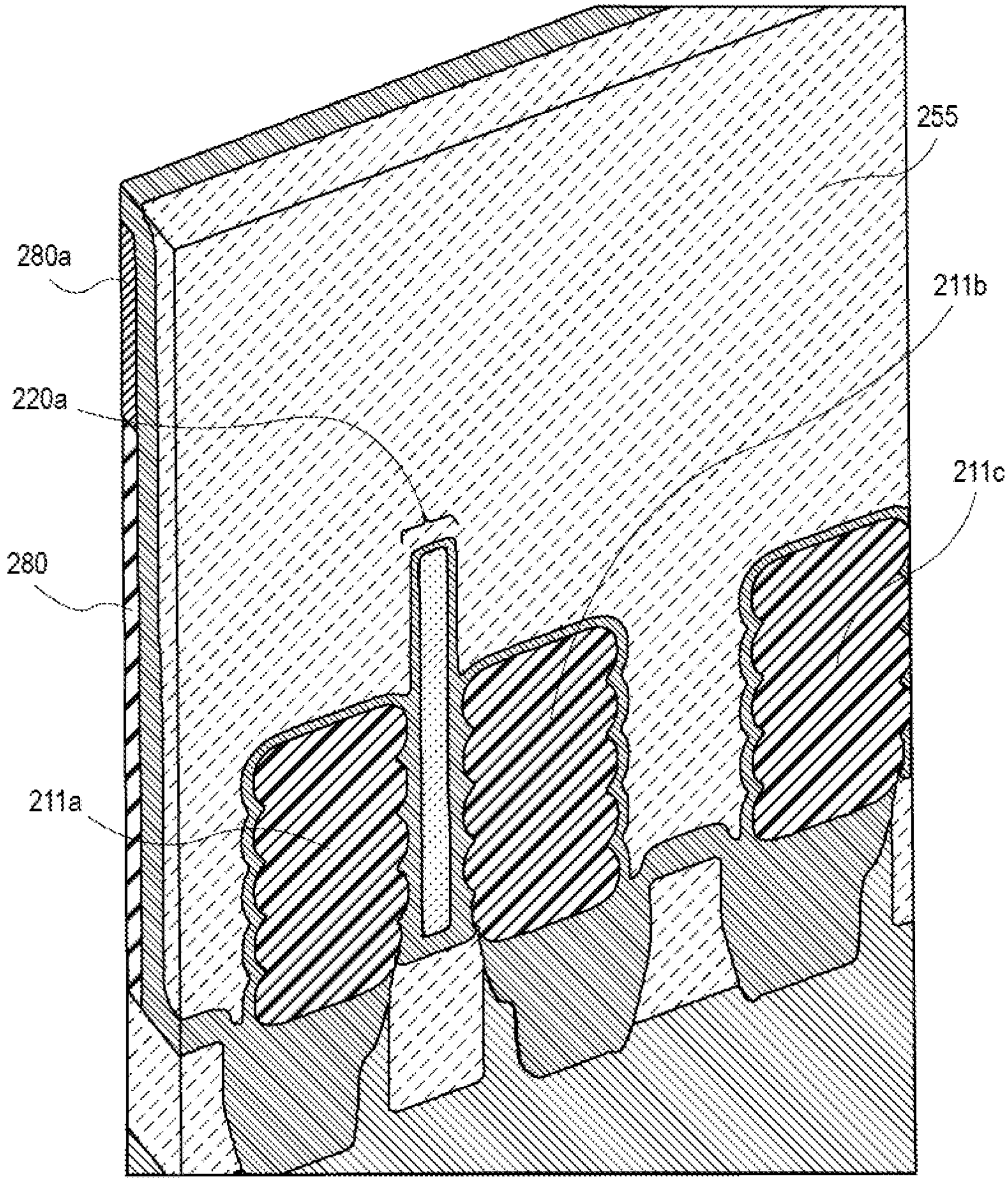

FIG. 2E illustrates a perspective view of a stage in the manufacturing process where a first epitaxial layer 211*a*, a second epitaxial layer 211*b*, and a third epitaxial layer 211*c*, which may be similar to first epitaxial layer 111*a*, second epitaxial layer 111*b*, and third epitaxial layer 111*c* may be grown, respectively, at the ends of first stack of nanoribbons 112, second stack of nanoribbons 114, and third stack of nanoribbons 116 that are flush with the dummy gate 280 of FIG. 2D. In embodiments, the wall structure 220*a* remains intact.

In embodiments, a dielectric 255 may be placed around the first epitaxial layer 211*a*, the second epitaxial layer 211*b*, the third epitaxial layer 211*c*, and the wall structure 220*a*. In embodiments, the dielectric 255, first epitaxial layer 211*a*, second epitaxial layer 211*b*, third epitaxial layer 211*c*, and wall structure 220*a* are in the same region as the drain 108 region of FIG. 1B.

Figure 2F:
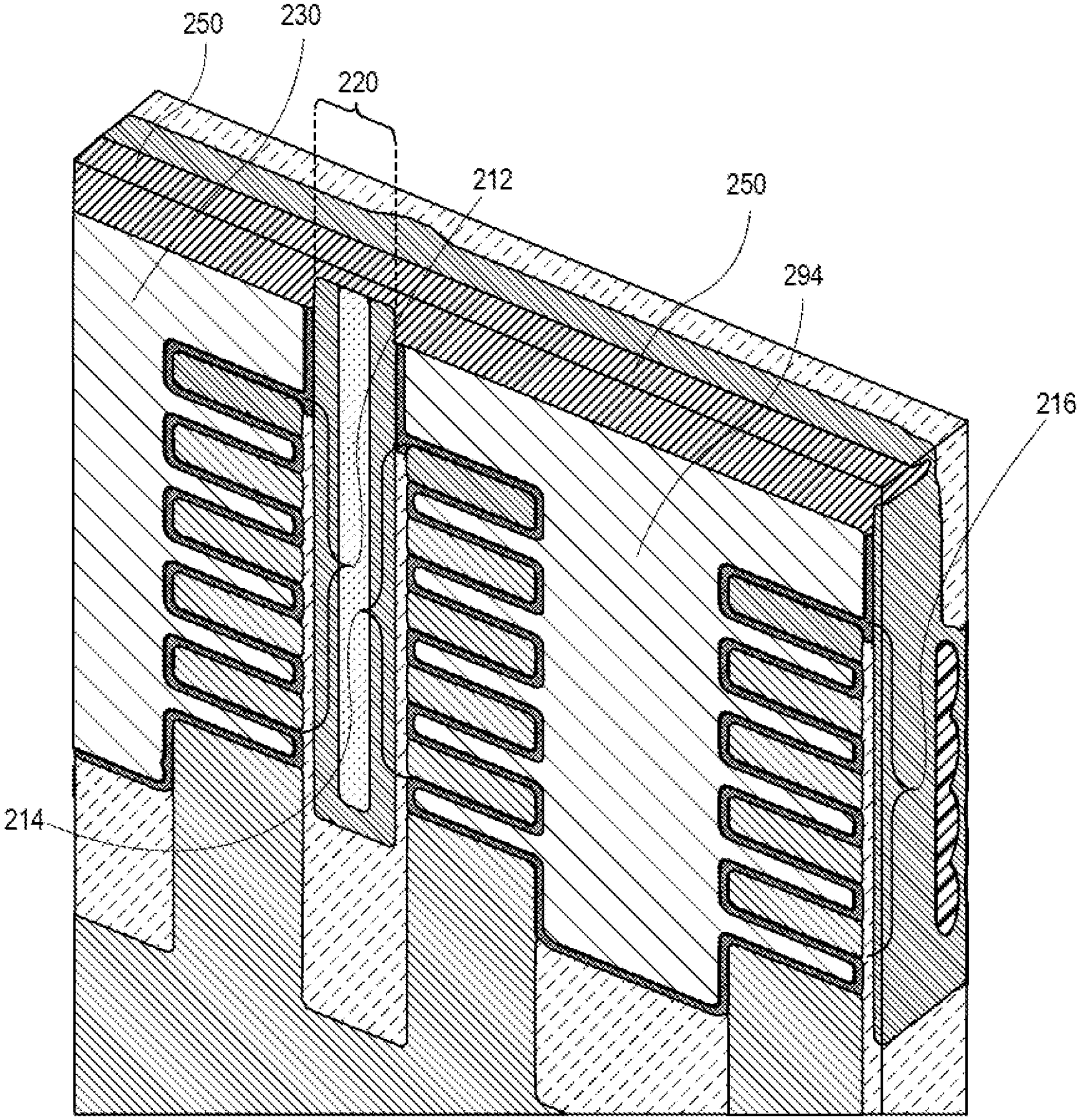

FIG. 2F illustrates a perspective view of a stage in the manufacturing process where the dummy gate cap 280*a* and dummy gate 280 of FIG. 2D have been etched out, along with the sacrificial material 213, 215, 217 as shown in FIG. 2A. FIG. 2F may be similar to FIG. 1A. A first gate metal 230, which may be similar to first gate metal 130 of FIG. 1A, is placed and comes into contact with the first stack of nanoribbons 212, which may be similar to the first stack of nanoribbons 112 of FIG. 1A, and with the wall 220, which is similar to wall structure 220*a* but has been planarized. A second gate metal 294 is placed and comes into contact with the second stack of nanoribbons 214 and the third stack of nanoribbons 216.

In embodiments, the wall 220 separates the first gate metal 230 from the second gate metal 294. In embodiments, the wall 220 electrically isolates the first gate metal 230 and the second gate metal 294 from each other. In embodiments, a gate insulator layer 250, which may be similar to gate insulator layer 150 of FIG. 1A may be placed on the first gate metal 230 and the second gate metal 294. In embodiments, the wall 220 extends above the first gate metal 230 and the second gate metal 294.

Figure 2G:
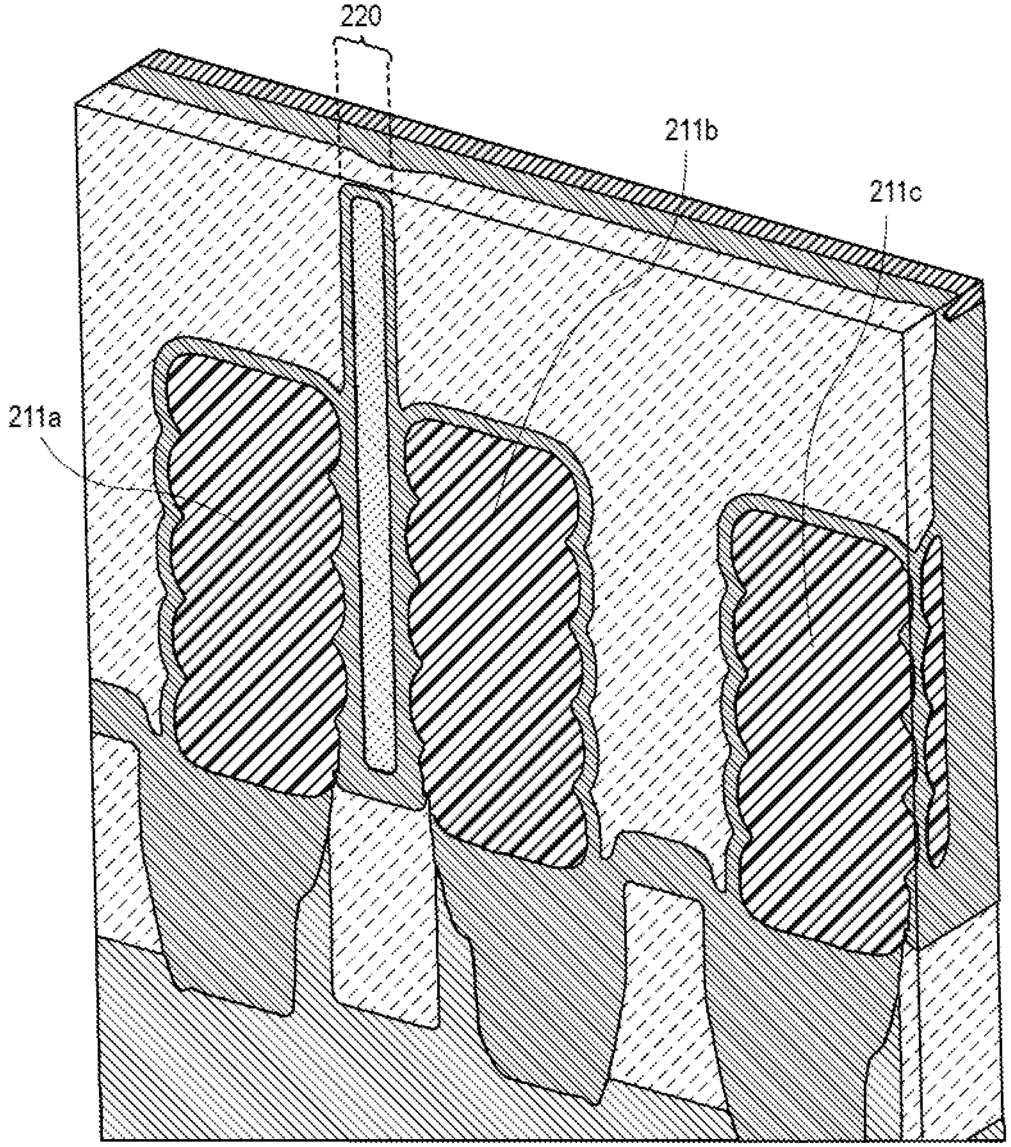

FIG. 2G illustrates a perspective view of a stage in the manufacturing process that shows the wall 220, which may be similar to wall structure 220*a*, but has been planarized. FIG. 2G may be similar to FIG. 2E, and includes first epitaxial layer 211*a*, second epitaxial layer 211*b*, and third epitaxial layer 211*c*.

Figure 2H:
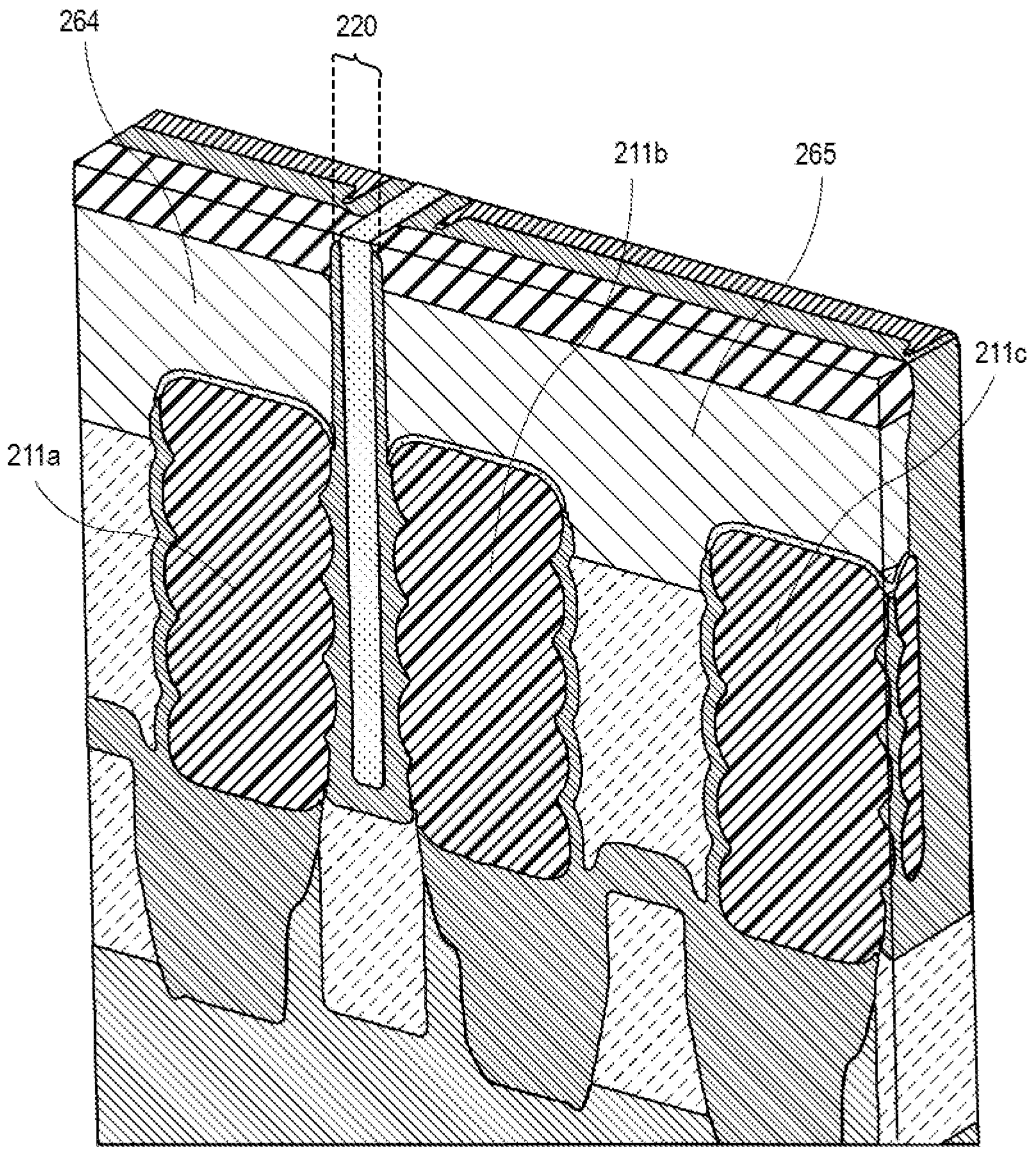

FIG. 2H illustrates a perspective view of a stage in the manufacturing process where a trench connector 264 is electrically coupled with the first epitaxial layer 211*a*, and where trench connector 265 is electrically coupled with the second epitaxial layer 211*b* and with third epitaxial layer 211*c*. In embodiments, the wall 220 separates and electrically isolates the trench connector 264 from the trench connector 265. In embodiments, trench connector 264 may be similar to first trench connector 164 of FIG. 1C, and trench connector 265 may be similar to second trench connector 166 of FIG. 1C.

Figure 2I:
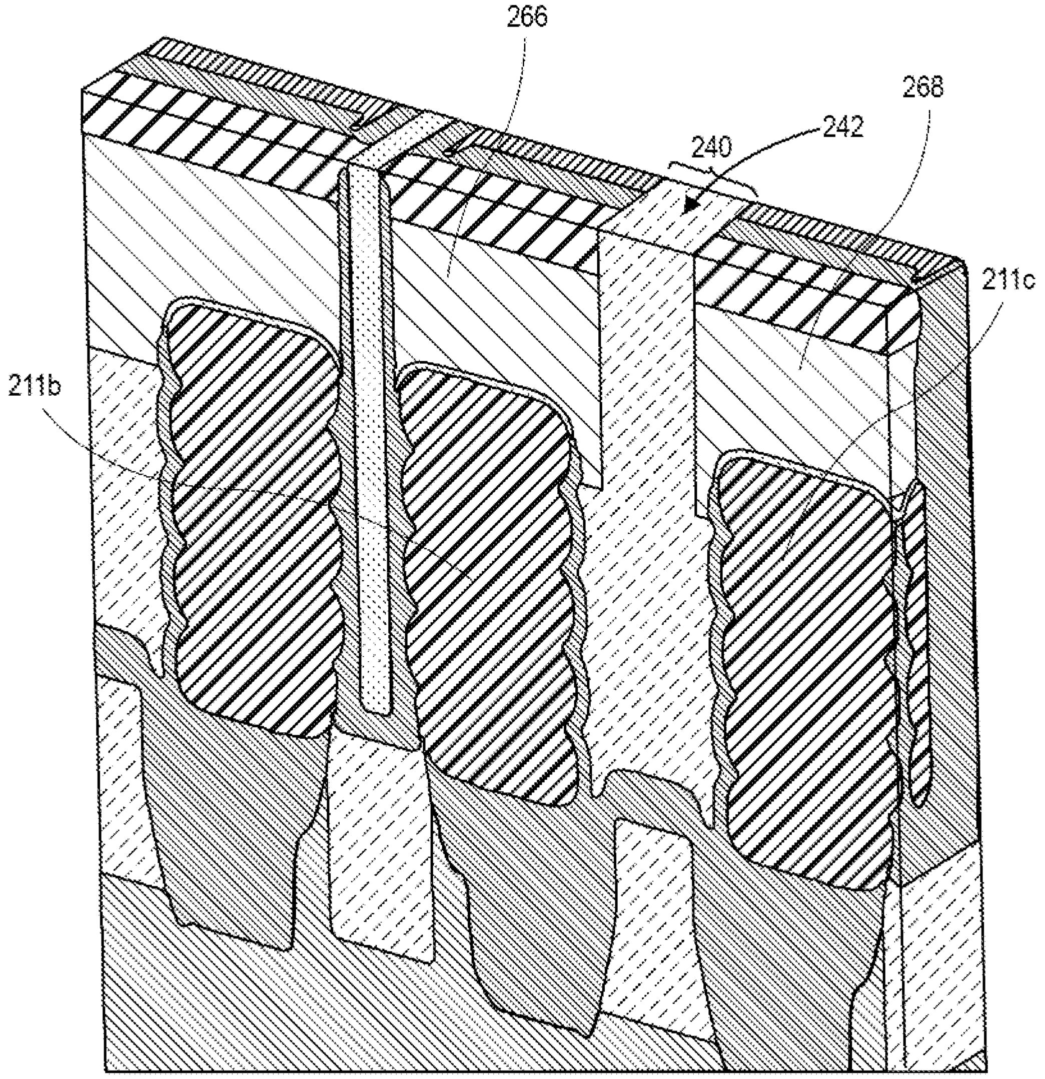

FIG. 2I illustrates a perspective view of a stage in the manufacturing process where a gate cut 240 is made through the trench connector 265 of FIG. 2H, creating trench connector 266, which may be similar to second trench connector 166 of FIG. 1C, and trench connector 268, which may be similar to third trench connector 168 of FIG. 1C. In embodiments, the gate cut 240 may be filled with a dielectric material 242. As a result, the gate cut 240 will electrically isolate the trench connector 266 and the trench connector 268 from each other.

Figure 2J:
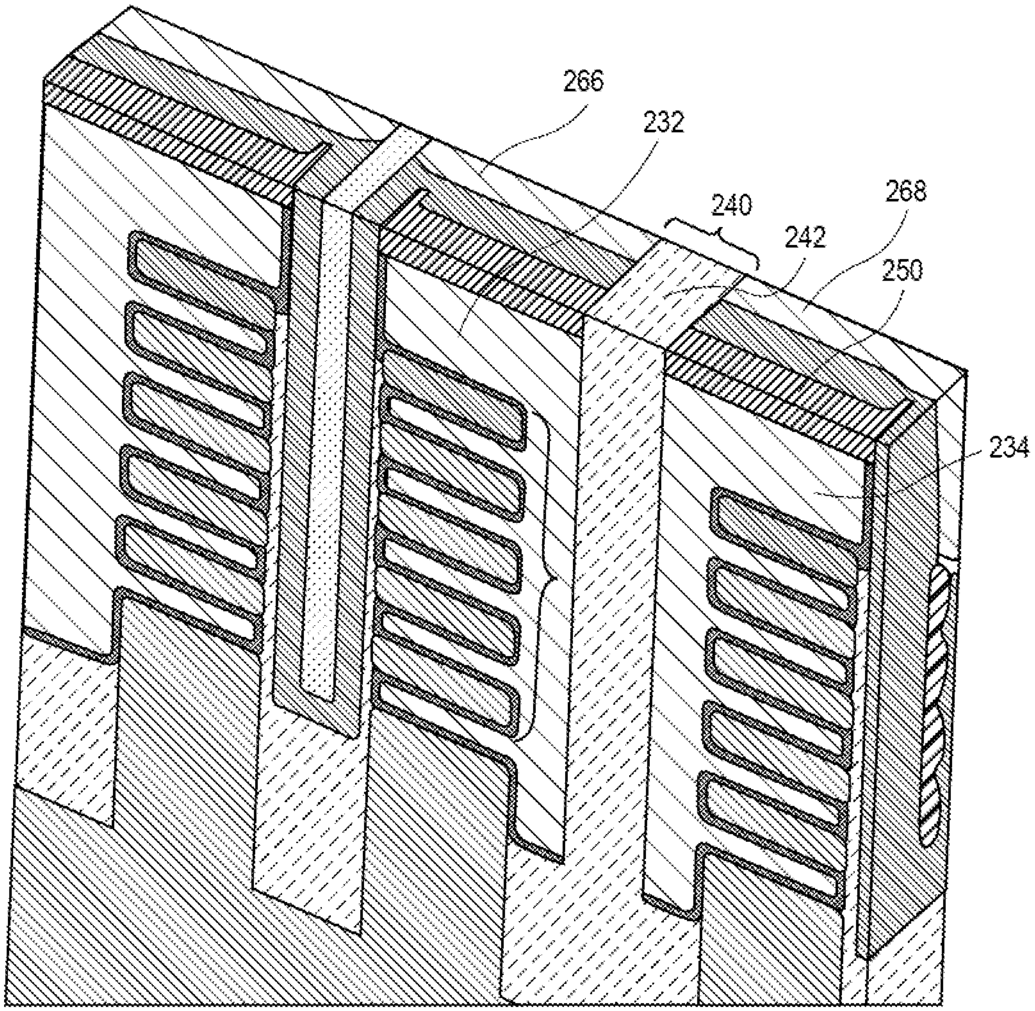

FIG. 2J illustrates a perspective view of a stage in the manufacturing process where the gate cut 240, which may be similar to gate cut 240 of FIG. 2I, is also made through the second gate metal 294 of FIG. 2F, to create a gate metal 232 and a gate metal 234 that are electrically isolated from each other. In embodiments, the gate cut 240 may be filled with a dielectric material 242. As shown, the gate cut 240 also electrically isolates the trench connector 268 from the trench connector 266 that is within the drain 108 of FIG. 1B.

Figure 3:
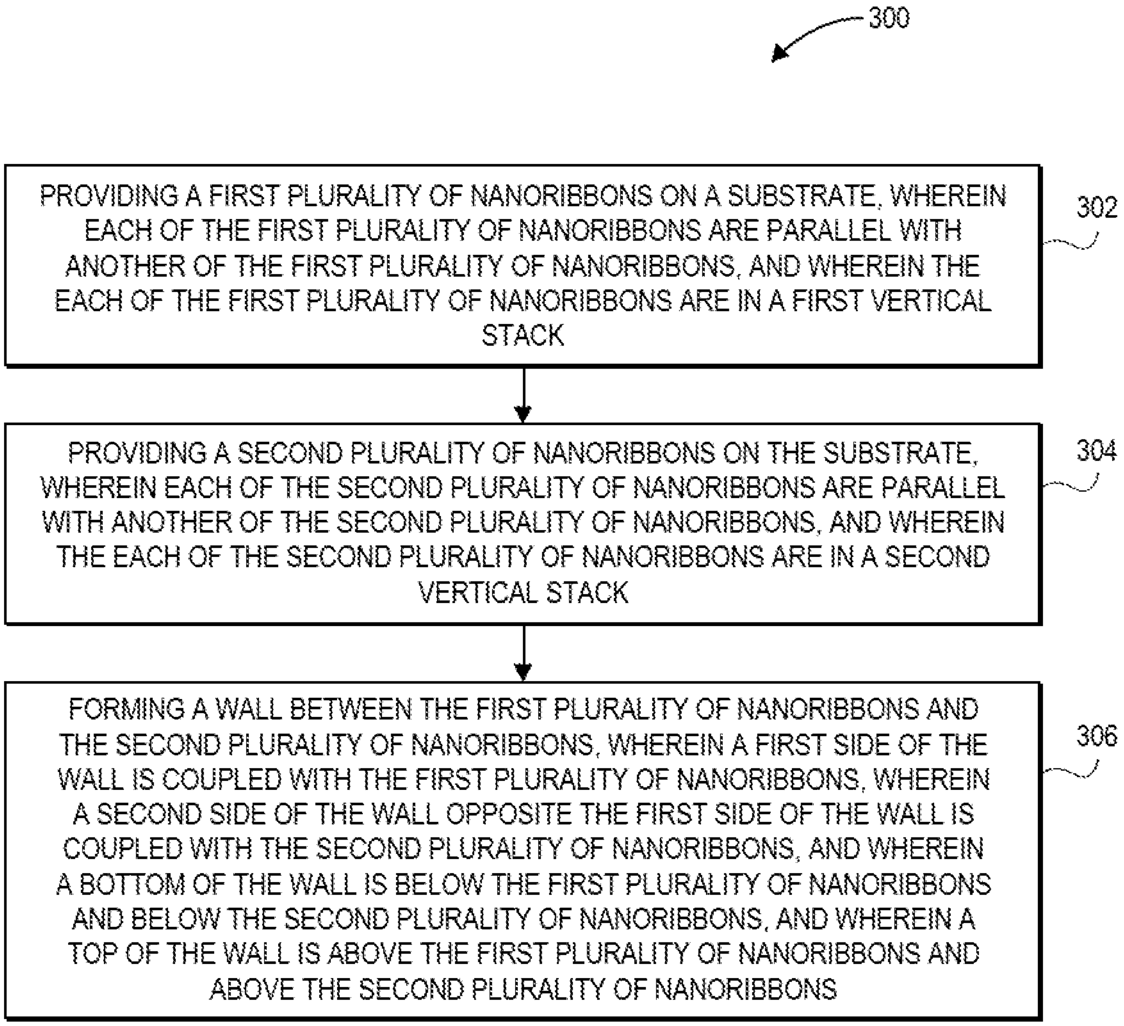
FIG. 3 illustrates an example process for creating a forkFET transistor structure that includes a wall coupled with two stacks of nanoribbons to electrically isolate gate metals, in accordance with various embodiments.

FIG. 3 illustrates an example process for creating a forkFET transistor structure that includes a wall coupled with two stacks of nanoribbons to electrically isolate gate metals, in accordance with various embodiments. Process 300 may be performed using the processes, apparatus, systems, and/or techniques described herein, and in particular with respect to FIGS. 1A-2J.

At block 302, the process may include providing a first plurality of nanoribbons on a substrate, wherein each of the first plurality of nanoribbons are parallel with another of the first plurality of nanoribbons, and wherein the each of the first plurality of nanoribbons are in a first vertical stack.

At block 304, the process may further include providing a second plurality of nanoribbons on the substrate, wherein each of the second plurality of nanoribbons are parallel with another of the second plurality of nanoribbons, and wherein the each of the second plurality of nanoribbons are in a second vertical stack.

At block 306, the process may further include forming a wall between the first plurality of nanoribbons and the second plurality of nanoribbons, wherein a first side of the wall is coupled with the first plurality of nanoribbons, wherein a second side of the wall opposite the first side of the wall is coupled with the second plurality of nanoribbons, and wherein a bottom of the wall is below the first plurality of nanoribbons and below the second plurality of nanoribbons, and wherein a top of the wall is above the first plurality of nanoribbons and above the second plurality of nanoribbons.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
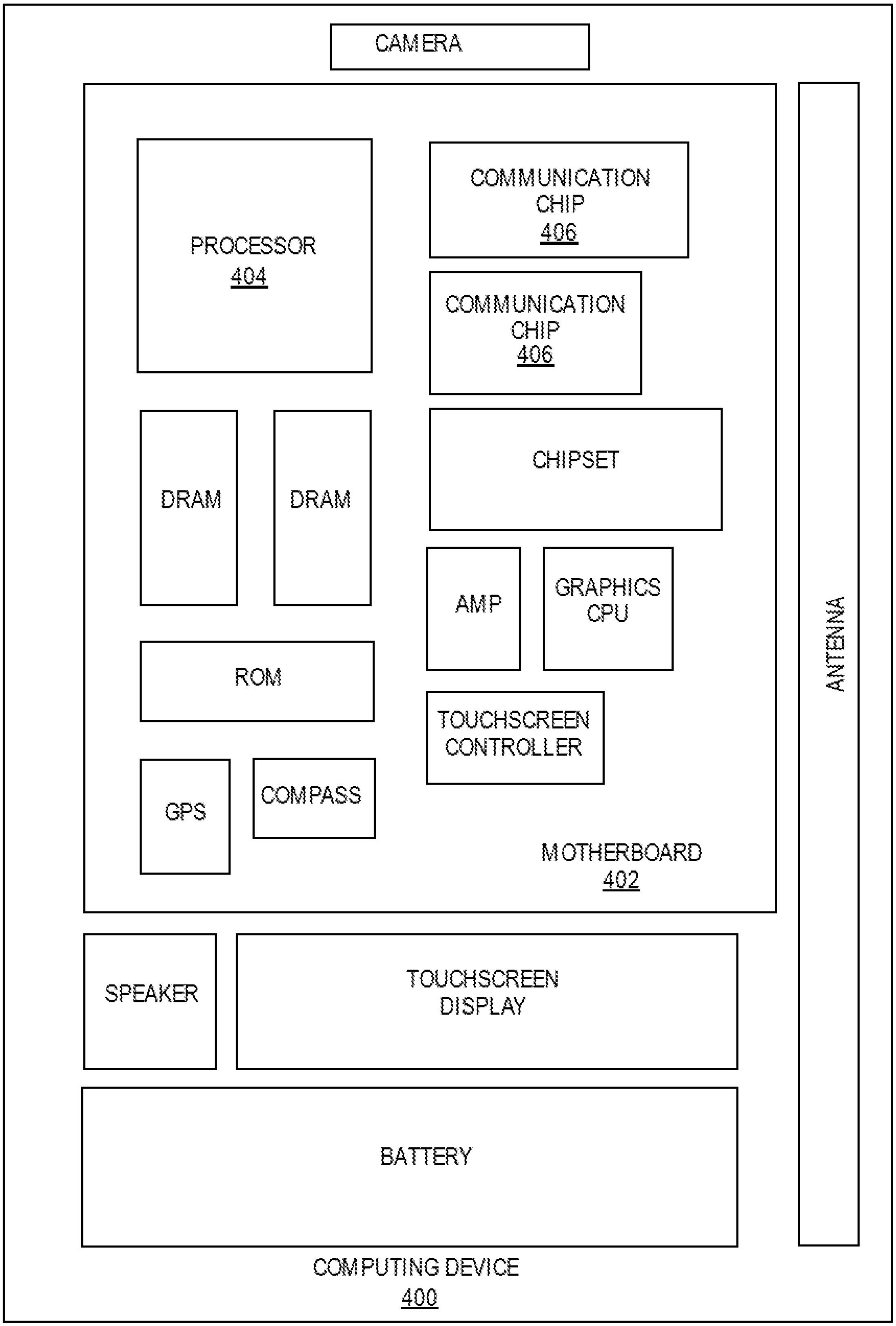
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
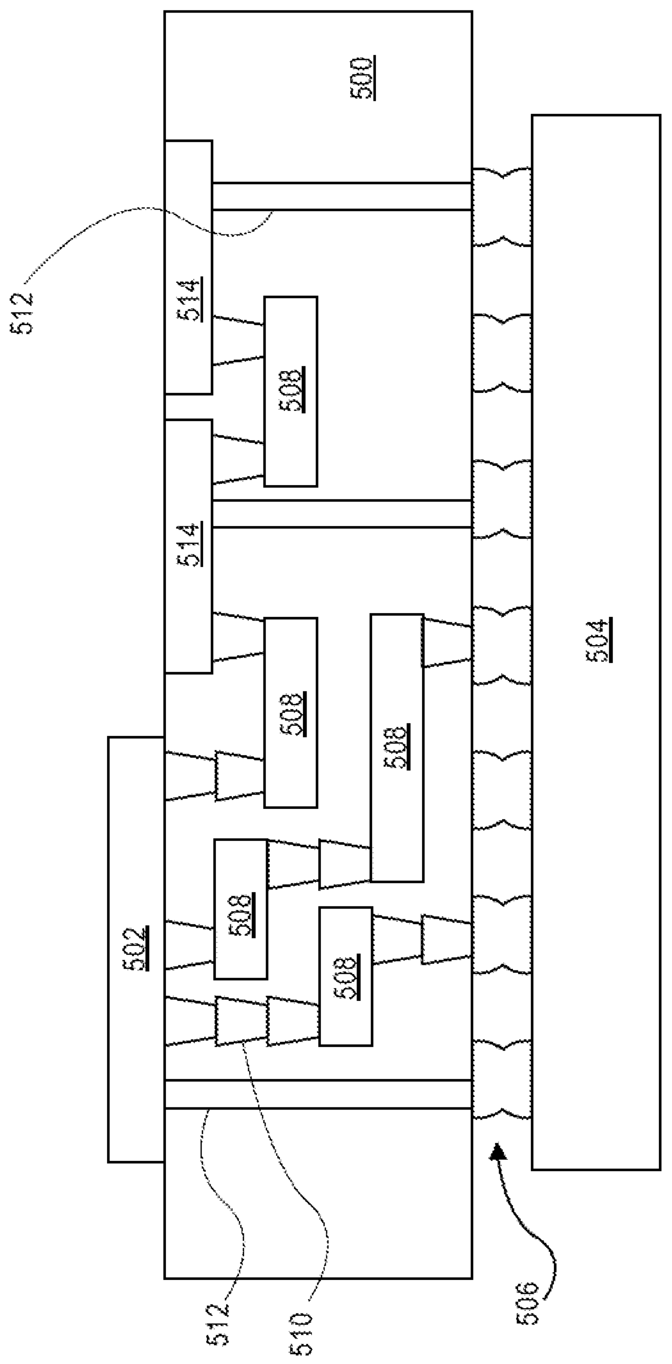
FIG. 5 illustrates an interposer that includes one or more embodiments of the invention.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an apparatus comprising: a first plurality of nanoribbons, wherein each of the first plurality of nanoribbons are parallel with another of the first plurality of nanoribbons, and wherein the each of the first plurality of nanoribbons are in a first vertical stack; a second plurality of nanoribbons, wherein each of the second plurality of nanoribbons are parallel with another of the second plurality of nanoribbons, and wherein the each of the second plurality of nanoribbons are in a second vertical stack; a first gate metal coupled with the first plurality of nanoribbons, wherein the first gate metal extends at least partially between the each of the first plurality of nanoribbons; a second gate metal coupled with the second plurality of nanoribbons, wherein the second gate metal extends at least partially between the each of the second plurality of nanoribbons; and a wall with a first side and a second side opposite the first side, wherein the first side of the wall is physically coupled with the first plurality of nanoribbons and the second side of the wall is physically coupled with the second plurality of nanoribbons, and wherein the wall separates the first gate metal from the second gate metal.

Example 2 includes the apparatus of example 1, wherein the first gate metal extends below a bottom nanoribbon of the first plurality of nanoribbons and wherein the first gate metal extends above a top nanoribbon of the first plurality of nanoribbons.

Example 3 includes the apparatus of examples 1 or 2, wherein the second gate metal extends below a bottom nanoribbon of the second plurality of nanoribbons and wherein the second gate metal extends above a top nanoribbon of the second plurality of nanoribbons.

Example 4 includes the apparatus of examples 1, 2, or 3, wherein the wall has a first edge and a second edge opposite the first edge, and wherein the first edge of the wall is below a bottom nanoribbon of the first plurality of nanoribbons and below a bottom nanoribbon of the second plurality of nanoribbons, and wherein the second edge of the wall is at or above a top of the first gate metal and at or above a top of the second gate metal.

Example 5 includes the apparatus of examples 1, 2, 3, or 4, further comprising a layer of insulation above the first gate metal and above the second gate metal, wherein second edge of the wall extends through the layer of insulation.

Example 6 includes the apparatus of examples 1, 2, 3, 4, or 5, wherein the wall electrically isolates the first gate metal and the second gate metal from each other.

Example 7 includes the apparatus of examples 1, 2, 3, 4, 5, or 6, wherein the wall includes a layer, and wherein the layer includes a dielectric.

Example 8 includes the apparatus of example 7, wherein the layer is a first layer and the dielectric is a first dielectric; and wherein the wall further includes a second layer, wherein the second layer includes a second dielectric.

Example 9 includes the apparatus of example 8, wherein the second layer at least partially surrounds the first layer.

Example 10 includes the apparatus of examples 7, 8, or 9, wherein the layer of the wall includes a selected one or more of: Hafnium, Aluminum, Titanium, Silicon, Carbon, Nitrogen, or Oxygen.

Example 11 is a semiconductor device comprising: a first stack of a first plurality of nanoribbons; a second stack of a second plurality of nanoribbons; a third stack of a third plurality of nanoribbons; a wall with a first side and a second side opposite the first side, wherein the first side of the wall is physically coupled with the first stack of the first plurality of nanoribbons and the second side of the wall is physically coupled with the second stack of the second plurality of nanoribbons; a first gate metal coupled with the first stack of the first plurality of nanoribbons, wherein the first gate metal extends at least partially between each of the first plurality of nanoribbons; second gate metal coupled with the second stack of the second plurality of nanoribbons and coupled with the third stack of the third plurality of nanoribbons, wherein the second gate metal extends at least partially between each of the second plurality of nanoribbons and extends at least partially between each of the third plurality of nanoribbons; and wherein the wall electrically isolates the first gate metal from the second gate metal.

Example 12 includes the semiconductor device of example 11, wherein the wall electrically isolates the first gate metal and the second gate metal from each other.

Example 13 includes the semiconductor device of examples 11 or 12, further comprising: a first epitaxial layer coupled with a side of the first stack of the first plurality of nanoribbons; a second epitaxial layer coupled with a side of the second stack of the second plurality of nanoribbons; and wherein the wall separates the first epitaxial layer from the second epitaxial layer.

Example 14 includes the semiconductor device of example 13, wherein the first epitaxial layer or the second epitaxial layer is a selected one of: a source or a drain.

Example 15 includes the semiconductor device of examples 13 or 14, further comprising: a third epitaxial layer coupled with a side of the third stack of the third plurality of nanoribbons; a dielectric layer that extends through the second gate metal, the dielectric layer separating the second gate metal into a third gate metal and a fourth gate metal, wherein the third gate metal and the fourth gate metal are electrically isolated from each other; and wherein the third gate metal extends at least partially between each of the second plurality of nanoribbons, and wherein the fourth gate metal extends at least partially between each of the third plurality of nanoribbons.

Example 16 includes the semiconductor device of example 15, wherein the dielectric layer is formed using a gate cut.

Example 17 includes the semiconductor device of examples 11, 12, 13, 14, 15, or 16, wherein the wall has a first edge and a second edge opposite the first edge, and wherein the first edge of the wall is below a bottom nanoribbon of the first stack of the first plurality of nanoribbons and below a bottom nanoribbon of the second stack of the second plurality of nanoribbons, and wherein the second edge of the wall is at or above a top of the first gate metal and at or above a top of the second gate metal.

Example 18 includes the semiconductor device of examples 11, 12, 13, 14, 15, 16, or 17, wherein the wall includes a dielectric material.

Example 19 includes the semiconductor device of example 18, wherein the wall includes a selected one or more of: Hafnium, Aluminum, Titanium, Silicon, Carbon, Nitrogen, or Oxygen.

Example 20 includes the semiconductor device of examples 11, 12, 13, 14, 15, 16, 17, 18, or 19, wherein the wall includes a first layer and a second layer, and wherein the first layer includes a first dielectric and the second layer includes a second dielectric.

Example 21 includes the semiconductor device of examples 11, 12, 13, 14, 15, 16, 17, 18, 19, or 20, wherein the second layer at least partially surrounds the first layer.

Example 22 is a method comprising: providing a first plurality of nanoribbons on a substrate, wherein each of the first plurality of nanoribbons are parallel with another of the first plurality of nanoribbons, and wherein the each of the first plurality of nanoribbons are in a first vertical stack; providing a second plurality of nanoribbons on the substrate, wherein each of the second plurality of nanoribbons are parallel with another of the second plurality of nanoribbons, and wherein the each of the second plurality of nanoribbons are in a second vertical stack; and forming a wall between the first plurality of nanoribbons and the second plurality of nanoribbons, wherein a first side of the wall is coupled with the first plurality of nanoribbons, wherein a second side of the wall opposite the first side of the wall is coupled with the second plurality of nanoribbons, and wherein a bottom of the wall is below the first plurality of nanoribbons and below the second plurality of nanoribbons, and wherein a top of the wall is above the first plurality of nanoribbons and above the second plurality of nanoribbons.

Example 23 includes the method of example 22, further comprising: coupling a first gate metal with the first plurality of nanoribbons, wherein the first gate metal extends at least partially between the each of the first plurality of nanoribbons; and coupling a second gate metal with the second plurality of nanoribbons, wherein the second gate metal extends at least partially between the each of the second plurality of nanoribbons, and wherein the wall electrically isolates the first gate metal and the second gate metal from each other.

Example 24 includes the method of examples 22 or 23, wherein the wall includes a first layer and a second layer, and wherein the first layer includes a first dielectric and the second layer includes a second dielectric.

Example 25 includes the method of examples 22, 23, or 24, wherein the wall includes a selected one or more of: Hafnium, Aluminum, Titanium, Silicon, Carbon, Nitrogen, or Oxygen.

What is claimed is:

1. An apparatus comprising:

a first plurality of nanoribbons, wherein each of the first plurality of nanoribbons are parallel with another of the first plurality of nanoribbons, and wherein the each of the first plurality of nanoribbons are in a first vertical stack;

a second plurality of nanoribbons, wherein each of the second plurality of nanoribbons are parallel with another of the second plurality of nanoribbons, and wherein the each of the second plurality of nanoribbons are in a second vertical stack;

a first gate metal coupled with the first plurality of nanoribbons, wherein the first gate metal extends at least partially between the each of the first plurality of nanoribbons;

a second gate metal coupled with the second plurality of nanoribbons, wherein the second gate metal extends at least partially between the each of the second plurality of nanoribbons; and a wall with a first side and a second side opposite the first side, wherein the first side of the wall is physically coupled with the first plurality of nanoribbons and the second side of the wall is physically coupled with the second plurality of nanoribbons, and wherein the wall separates the first gate metal from the second gate metal.

2. The apparatus of claim 1, wherein the first gate metal extends below a bottom nanoribbon of the first plurality of nanoribbons and wherein the first gate metal extends above a top nanoribbon of the first plurality of nanoribbons.

3. The apparatus of claim 1, wherein the second gate metal extends below a bottom nanoribbon of the second plurality of nanoribbons and wherein the second gate metal extends above a top nanoribbon of the second plurality of nanoribbons.

4. The apparatus of claim 1, wherein the wall has a first edge and a second edge opposite the first edge, and wherein the first edge of the wall is below a bottom nanoribbon of the first plurality of nanoribbons and below a bottom nanoribbon of the second plurality of nanoribbons, and wherein the second edge of the wall is at or above a top of the first gate metal and at or above a top of the second gate metal.

5. The apparatus of claim 1, further comprising a layer of insulation above the first gate metal and above the second gate metal, wherein second edge of the wall extends through the layer of insulation.

6. The apparatus of claim 1, wherein the wall electrically isolates the first gate metal and the second gate metal from each other.

7. The apparatus of claim 1, wherein the wall includes a layer, wherein the layer includes a dielectric.

8. The apparatus of claim 7, wherein the layer is a first layer and the dielectric is a first dielectric; and wherein the wall further includes a second layer, and wherein the second layer includes a second dielectric.

9. The apparatus of claim 8, wherein the second layer at least partially surrounds the first layer.

10. The apparatus of claim 7, wherein the layer of the wall includes a selected one or more of: Hafnium, Aluminum, Titanium, Silicon, Carbon, Nitrogen, or Oxygen.

11. A semiconductor device comprising:

a first stack of a first plurality of nanoribbons;

a second stack of a second plurality of nanoribbons;

a third stack of a third plurality of nanoribbons;

a wall with a first side and a second side opposite the first side, wherein the first side of the wall is physically coupled with the first stack of the first plurality of nanoribbons and the second side of the wall is physically coupled with the second stack of the second plurality of nanoribbons;

a first gate metal coupled with the first stack of the first plurality of nanoribbons, wherein the first gate metal extends at least partially between each of the first plurality of nanoribbons;

second gate metal coupled with the second stack of the second plurality of nanoribbons and coupled with the third stack of the third plurality of nanoribbons, wherein the second gate metal extends at least partially between each of the second plurality of nanoribbons and extends at least partially between each of the third plurality of nanoribbons; and wherein the wall electrically isolates the first gate metal from the second gate metal.

12. The semiconductor device of claim 11, further comprising:

a first epitaxial layer coupled with a side of the first stack of the first plurality of nanoribbons;

a second epitaxial layer coupled with a side of the second stack of the second plurality of nanoribbons; and wherein the wall separates the first epitaxial layer from the second epitaxial layer.

13. The semiconductor device of claim 12, wherein the first epitaxial layer or the second epitaxial layer is a selected one of: a source or a drain.

14. The semiconductor device of claim 12, further comprising:

a third epitaxial layer coupled with a side of the third stack of the third plurality of nanoribbons;

a dielectric layer that extends through the second gate metal, the dielectric layer separating the second gate metal into a third gate metal and a fourth gate metal, wherein the third gate metal and the fourth gate metal are electrically isolated from each other; and wherein the third gate metal extends at least partially between each of the second plurality of nanoribbons, and wherein the fourth gate metal extends at least partially between each of the third plurality of nanoribbons.

15. The semiconductor device of claim 14, wherein the dielectric layer is formed using a gate cut.

16. The semiconductor device of claim 11, wherein the wall has a first edge and a second edge opposite the first edge, and wherein the first edge of the wall is below a bottom nanoribbon of the first stack of the first plurality of nanoribbons and below a bottom nanoribbon of the second stack of the second plurality of nanoribbons, and wherein the second edge of the wall is at or above a top of the first gate metal and at or above a top of the second gate metal.

17. The semiconductor device of claim 11, wherein the wall includes a dielectric material.

18. The semiconductor device of claim 17, wherein the wall includes a selected one or more of: Hafnium, Aluminum, Titanium, Silicon, Carbon, Nitrogen, or Oxygen.

19. The semiconductor device of claim 11, wherein the wall includes a first layer and a second layer, and wherein the first layer includes a first dielectric and the second layer includes a second dielectric.

20. The semiconductor device of claim 11, wherein the second layer at least partially surrounds the first layer.

21. A method comprising:

providing a first plurality of nanoribbons on a substrate, wherein each of the first plurality of nanoribbons are parallel with another of the first plurality of nanoribbons, and wherein the each of the first plurality of nanoribbons are in a first vertical stack;

providing a second plurality of nanoribbons on the substrate, wherein each of the second plurality of nanoribbons are parallel with another of the second plurality of nanoribbons, and wherein the each of the second plurality of nanoribbons are in a second vertical stack;

forming a wall between the first plurality of nanoribbons and the second plurality of nanoribbons, wherein a first side of the wall is coupled with the first plurality of nanoribbons, wherein a second side of the wall opposite the first side of the wall is coupled with the second plurality of nanoribbons, and wherein a bottom of the wall is below the first plurality of nanoribbons and below the second plurality of nanoribbons, and wherein a top of the wall is above the first plurality of nanoribbons and above the second plurality of nanoribbons;

coupling a first gate metal with the first plurality of nanoribbons, wherein the first gate metal extends at least partially between the each of the first plurality of nanoribbons; and coupling a second gate metal with the second plurality of nanoribbons, wherein the second gate metal extends at least partially between the each of the second plurality of nanoribbons, and wherein the wall electrically isolates the first gate metal and the second gate metal from each other.

22. The method of claim 21, wherein the wall includes a first layer and a second layer, and wherein the first layer includes a first dielectric and the second layer includes a second dielectric.

23. The method of claim 21, wherein the wall includes a selected one or more of: Hafnium, Aluminum, Titanium, Silicon, Carbon, Nitrogen, or Oxygen.

* * * * *